United States Patent [19]

Baba

[11] Patent Number: 5,319,305
[45] Date of Patent: Jun. 7, 1994

[54] AUTOMATIC RANGE SELECTION-TYPE ANALOG TESTER

[75] Inventor: Nobuharu Baba, Tokyo, Japan

[73] Assignee: Kabushiki Kaisha Sanwa Keiki Seisakusho, Tokyo, Japan

[21] Appl. No.: 50,731

[22] Filed: Apr. 20, 1993

Related U.S. Application Data

[63] Continuation of Ser. No. 801,259, Dec. 3, 1991, abandoned.

[51] Int. Cl.⁵ ............................................. G01R 15/08
[52] U.S. Cl. ..................................... 324/115; 324/116
[58] Field of Search ..................... 324/103 R, 115, 116, 324/99 D, 121 R; 340/753, 754; 341/139; 345/38

[56] References Cited

U.S. PATENT DOCUMENTS

| | | | |
|---|---|---|---|
| 2,606,943 | 8/1952 | Barker | 324/115 |
| 2,643,344 | 6/1953 | McLaren et al. | 324/115 |
| 2,889,518 | 6/1959 | Hudson et al. | 324/115 |
| 3,237,102 | 2/1966 | Newell | 324/115 |
| 3,958,178 | 5/1976 | Mueller et al. | 324/115 |
| 4,096,434 | 6/1978 | Meyer | 324/115 |
| 4,114,094 | 9/1978 | Cook et al. | 324/99 D |
| 5,119,019 | 6/1992 | George | 324/115 |
| 5,218,290 | 6/1993 | Beckert et al. | 324/115 |

OTHER PUBLICATIONS

Intersil–A046 Building a Battery Operated Auto Ranging DVM . . . 106 (Pub. by . . . Inc.) pp. 1–4, 1980 (no month).

"Converter used to produce an autoranging digital multimeter"; Electron, No. 118; Jun. 9, 1977; pp. 52, 54.

*Primary Examiner*—Vinh Nguyen
*Attorney, Agent, or Firm*—Ladas & Parry

[57] ABSTRACT

An automatic range selection-type analog tester capable of automatically switching to the optimum measuring range even if the measurand of an object to be measured is undetermined. A range select signal generating circuit is designed to generate a range select signal for selecting one of a plurality of voltage dividers of a range selector circuit in such a manner that the divided voltage output of the object divided through the range selector circuit comes into a predetermined range and also a range display displays the corresponding measuring range in accordance with the range select signal.

2 Claims, 4 Drawing Sheets

AUTOMATIC RANGE SELECTION-TYPE ANALOG TESTER

This is a continuation of copending application Ser. No. 07/801,259 filed on Dec. 3, 1991, now abandoned.

The present invention relates to an analog tester and more particularly to the selection of desired one of a plurality of measuring ranges.

In the past, it has been the practice to provide an analog tester with a range selector switch for selecting one of a plurality of measuring ranges corresponding for example to a voltage value, current value or resistance value to be measured whereby during the measurement the range selector switch selects and sets one of the measuring ranges which is suitable for the measurement thereby measuring an object to be measured.

However, the conventional analog tester has been such that where the measurand of an object to be measured is undetermined, it is necessary to successively set the measuring ranges from the maximum measuring range until the suitable measuring range is set. As a result, not only the measurement has required much labor and time but also sophisticated experiences have been needed, thereby making the operation extremely difficult for the beginners. There has been a disadvantage that if the operation is performed erroneously during the measurement, not only the tester is damaged but also the object to be measured is damaged, and the measurer himself is also exposed to danger.

The present invention has been made to overcome the foregoing problems in the art and it is an object of the present invention to provide an automatic range selection-type analog tester so designed that even if the measurand of an object to be measured is undetermined, the changeover to the optimum measuring range is effected automatically.

The automatic range selection-type analog tester according to the present invention includes a selection circuit for selecting one of a number of objects to be measured such as, voltage, current and resistance, a range selector circuit including a plurality of voltage dividers respectively set in correspondence to a plurality of measuring ranges for each of the objects to be measured whereby one of the voltage dividers is selected in accordance with an applied range select signal and the input value from the object applied through the selection circuit is subjected to voltage division and generated, a range select signal generating circuit having a predetermined upper limit value and lower limit value for generating a range select signal for selecting that voltage divider which brings the divided voltage output of the range selector circuit into its predetermined range, an indicator including plurality of scales predetermined in correspondence to the measuring ranges to indicate the input value of the object to be measured on the corresponding scale in accordance with the divided voltage output of the selected voltage divider, and range display means arranged in correspondence to the measuring ranges to select and display the corresponding measuring range in accordance with the range select signal.

In accordance with the present invention, when the input value from an object to be measured is applied to the range selector circuit through the selection circuit, the range selector circuit subject the input value to voltage division in accordance with the then applied range select signal, thereby applying its divided voltage output to the indicator and the range select signal generating circuit. During the time that the indicator is moving its pointer in accordance with the applied divided voltage output, the range select signal generating circuit determines whether the divided voltage output is within a predetermined range of values. If the divided voltage output is within the predetermined range of values, the pointer of the indicator indicates the input value from the object to be measured to maintain the range select signal being generated. Also, the range display means selects and displays the measuring range corresponding to this range select signal.

When the above-mentioned divided voltage output is beyond the predetermined range, the range select signal generating circuit applies to the range selector circuit a range select signal for selecting that voltage divider such that its divided voltage output comes into the predetermined range, with the result that the range selector circuit newly divides the applied input value from the object in accordance with the range select signal, and also the range display means changes the measuring range being displayed to the corresponding measuring range to display it.

The invention may be put into practice in various ways and one specific embodiment will be described to illustrate the invention with reference to the accompanying diagrammatic representations in which.

Figure 1:
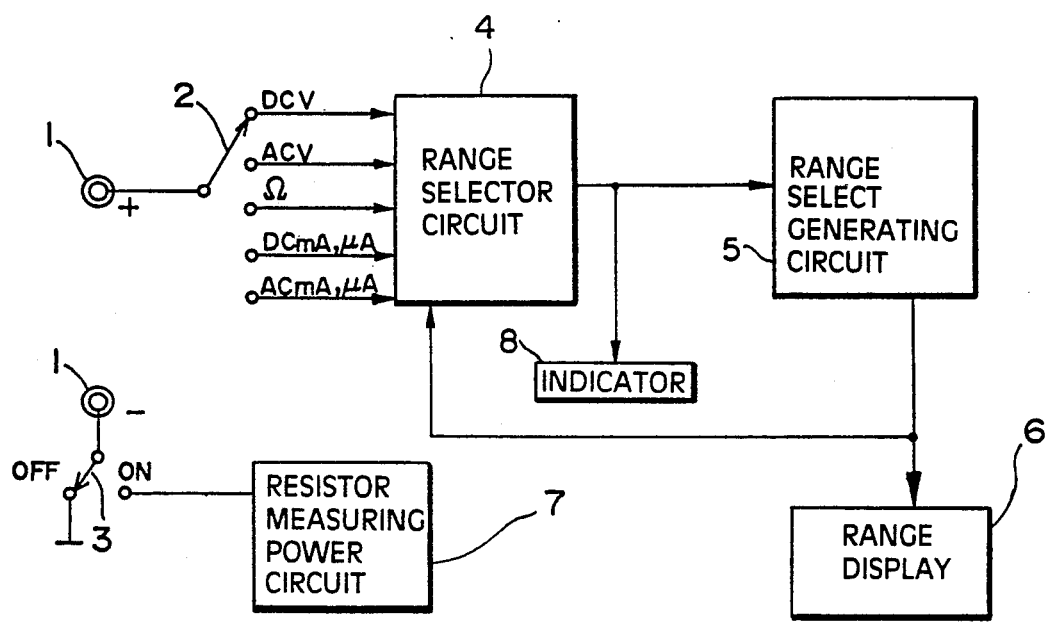
FIG. 1 is a block diagram showing the construction of the present invention.
Figure 2A:
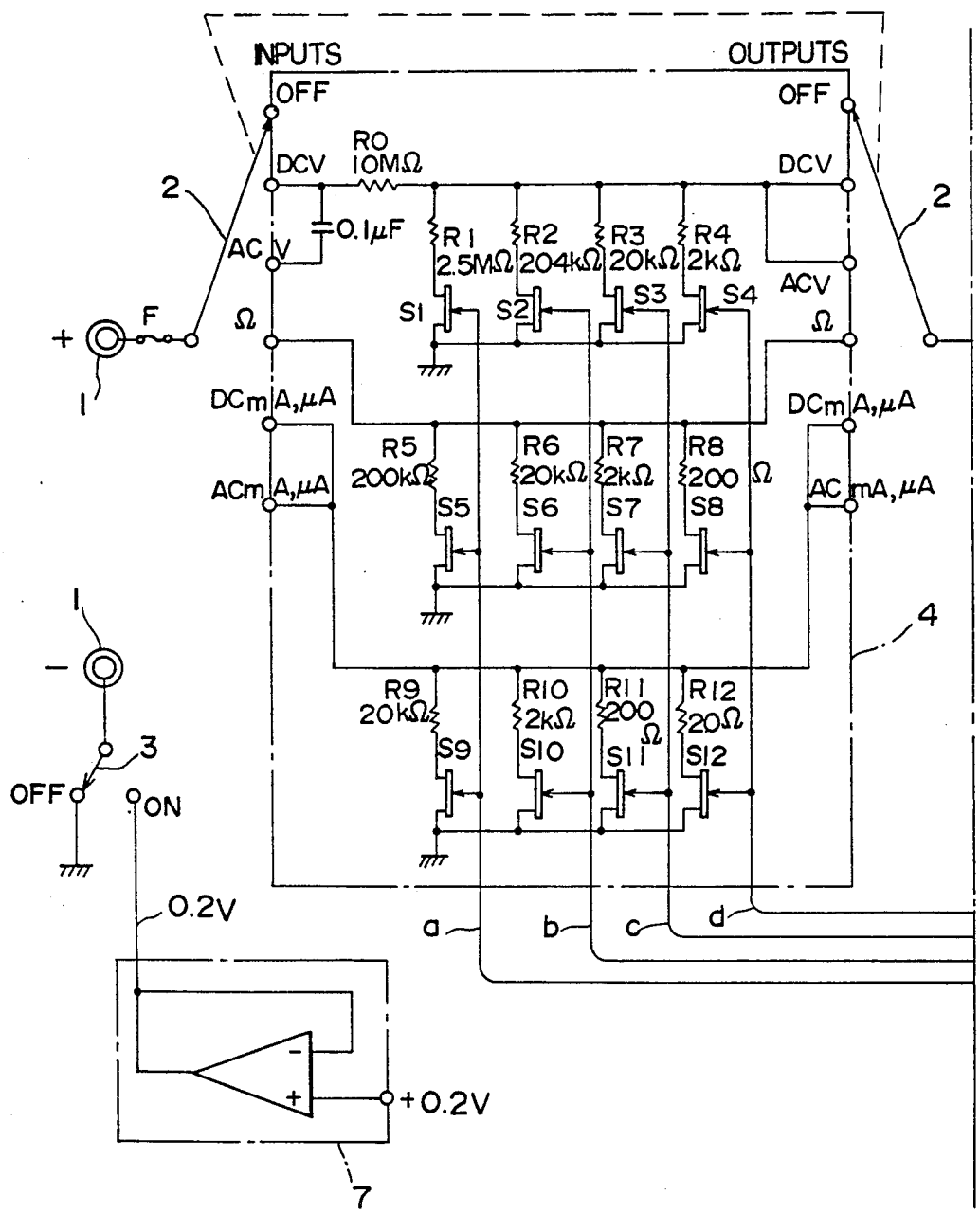
FIG. 2A and 2B are a circuit diagram of an automatic range selection-type analog tester, showing an embodiment of the present invention.
Figure 2B:
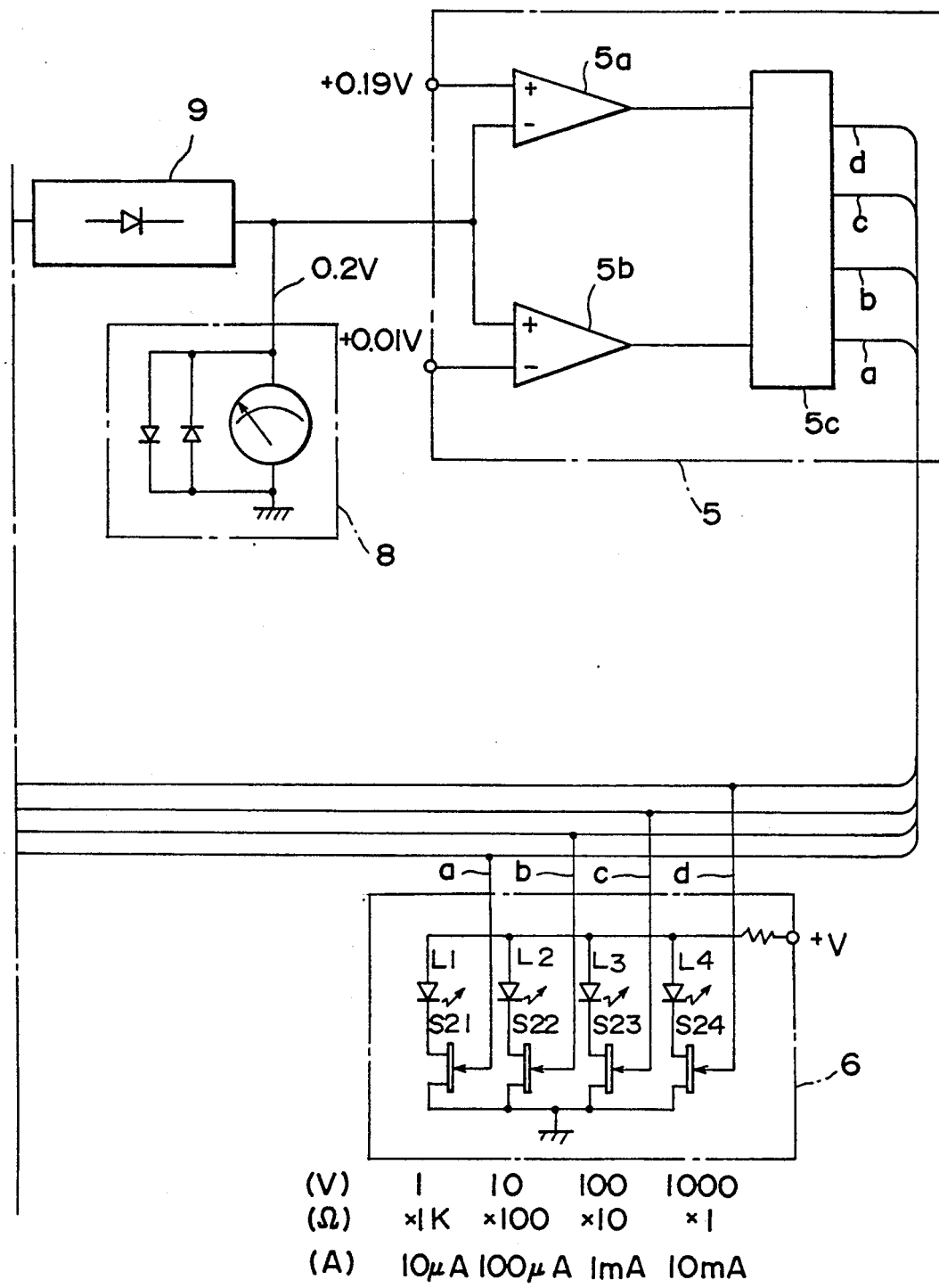

In these Figures, numeral (1) designates a measuring terminal, and (2) a selector switch for selecting for example one of objects to be measured, e.g., DC voltage (DCV), AC voltage (ACV), resistance ($\Omega$), DC current (DCmA, $\mu$A) and AC current (ACmA, $\mu$A). Numeral (3) designates a resistor measuring power supply switch which is turned on only when the object to be measured is resistance ($\Omega$). Numeral (4) designates a range selector circuit including a plurality of voltage dividers corresponding to a plurality of measuring ranges according to the respective objects to be measured, i.e., resistors ($R_o$–$R_{12}$) and transistor switching elements ($S_11$–$S_{12}$) as shown in FIG. 2A and before the measurement the switching elements ($S_1$), ($S_5$) and ($S_9$) are turned on in response to the application of a range select signal (a) which will be described later. Switch (2) selects the input to the circuit (4) corresponding to the measured object and the corresponding output of the circuit (4).

Numeral (5) designates a range select signal generating circuit including comparators ($5a$) and ($5b$) each designed to compare the divided voltage output of the range selector circuit (4) through a detection circuit (9) and a reference voltage and a shift register ($5c$) responsive to the output signals from the comparators ($5a$) and ($5b$) to generate a range select signal.

The comparator ($5a$) receives the reference voltage of 0.19 V at its positive terminal so that when a divided voltage output higher than the reference voltage is applied, a polarity-inverted negative potential signal is generated. The comparator ($5b$) receives the reference voltage of 0.01 V at its negative terminal so that when divided voltage output lower than the reference voltage is applied, a polarity-inverted negative potential signal is generated. When the negative potential signal from the comparator ($5a$) is applied, the shift register ($5c$) shifts up one place so that as for example, the changeover from the range select signal (a) being generated to a range select signal (b) is effected thereby generating the latter. On the other hand, when the negative potential signal from the comparator ($5b$) is applied, the shift register ($5c$) shifts down one place so that as for example, the changeover from the range select signal (b) being generated to the range select signal (a) is effected thereby generating the latter.

It is to be noted that before the measurement the divided voltage output is 0 volt so that the range select signal (a) is generated and the switching elements ($S_1$), ($S_5$) and ($S_9$) are turned on.

Numeral (6) designates a range display including light-emitting diodes ($L_1$) to ($L_4$) (hereinafter referred to as 'LEDs') each adapted for displaying the corresponding measuring range and transistor switching elements ($S_{21}$) to ($S_{24}$) for respectively turning the LEDs ($L_1$) to ($L_4$) on and off, and each of the switching elements ($S_{21}$) to ($S_{24}$) is turned on in response to the application of one of the range select signals from the range select signal generating circuit (5). Since the range select signal (a) is generated before the measurement as mentioned previously, the LED($L_1$) is turned on in the range display (6).

Numeral (7) designates a resistor measuring power circuit including an operational amplifier for supplying a constant voltage power supply of 0.2 V when the object to be measured is a resistor, and (B) an indicator for indicating the input voltage from the object in accordance with the divided voltage output of the range selector circuit (4) applied through the detection circuit (9).

Next, a description will be made of the operation of measuring an -object to be measured having a DC voltage of 20 V by the automatic range selection-type analog tester constructed as described above.

Figure 3:
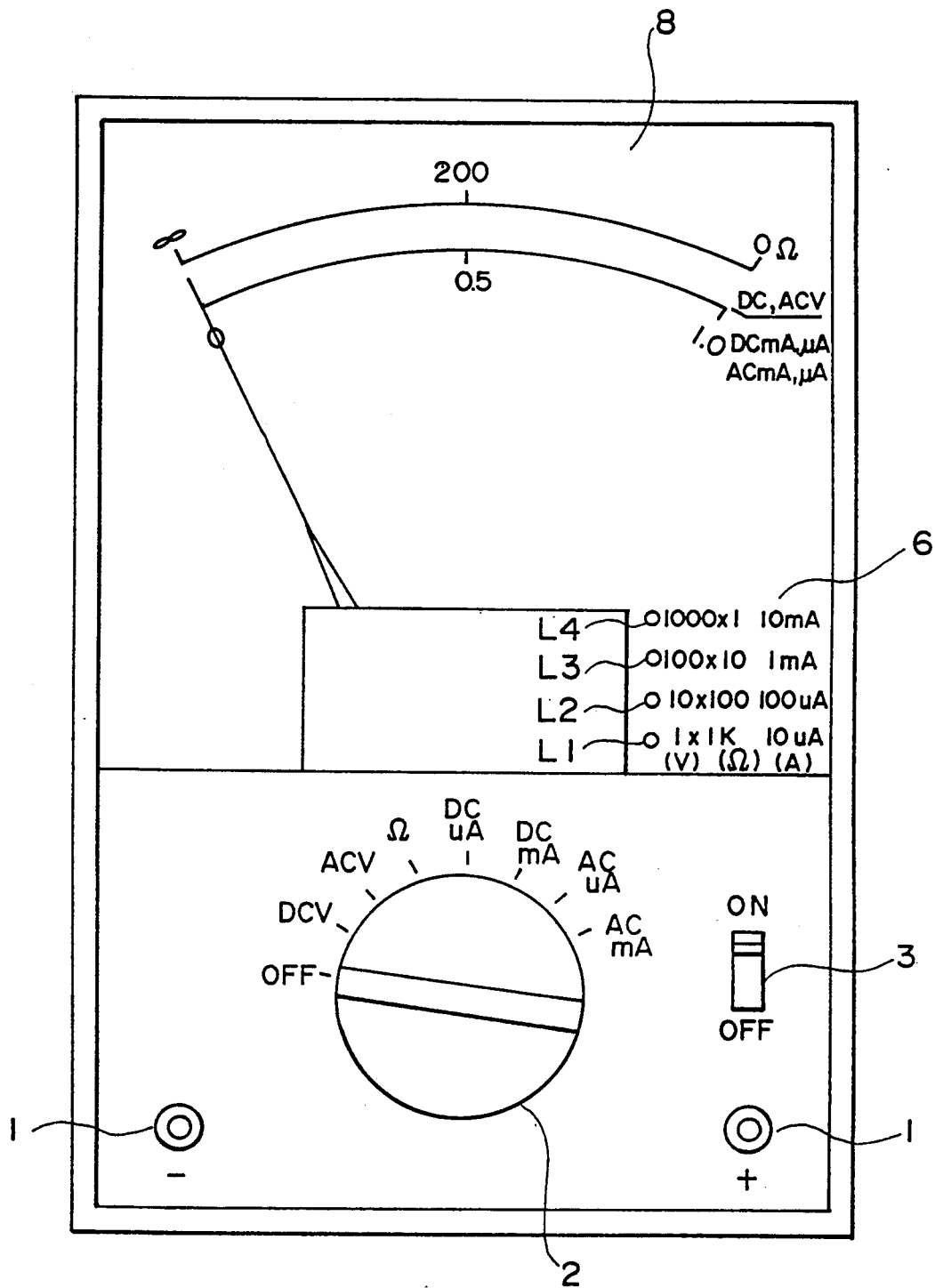
FIG. 3 is a front view showing the front of the tester in simplified form.

As shown in FIG. 3, when the selector switch (2) is set to the DCV and the tester is connected to the object by the test prod (not shown) inserted into the measuring terminal (1), the input voltage (20 V) is divided with the voltage division ratio (1:4) of the resistors ($R_o$) and ($R_1$) in the range selector circuit(4) so that the resulting divided voltage output of 5 V is applied to the indicator (8) and the range select signal generating circuit (5) through the detection circuit (9). The indicator (8) moves the pointer in accordance with the applied divided voltage output. At this time, in the range select signal generating circuit(5) receiving the divided voltage output simultaneously, the comparators ($5a$) and ($5b$) determine whether the divided voltage output is within a predetermined range (0.01–0.19 V). In this case, in the comparator ($5a$) the applied divided voltage output (5 V) is higher than the reference voltage (0.19 V) and therefore a polarity-inverted negative potential signal is applied to the shift register ($5c$), whereas in the comparator ($5b$) the divided voltage output is higher than the reference voltage (0.01 V) and therefore a positive potential signal is applied to the shift register ($5c$). In accordance with the signal from the comparator ($5a$), the shift register ($5c$) shifts up one place so that the changeover from the range select signal (a) to the range select signal (b) is effected thus applying the latter signal to the range selector circuit (4) and the switching elements ($S_2$), ($S_6$) and ($S_{10}$) are turned on.

When the switching element ($S_2$) is turned on, the input voltage (20 V) from the object to be measured results in a divided voltage output of 0.4 V due to the voltage division ratio (1:49) of the resistors ($R_O$) and ($R_2$) and it is generated in the like manner as mentioned previously. When the new divided voltage output is applied to the range select signal generating circuit (5), this divided voltage output is compared in the comparators ($5a$) and ($5b$), respectively. In the comparator ($5a$) the divided voltage output is higher than the reference voltage and therefore a polarity-inverted negative potential signal is applied to the shift register ($5c$), whereas in the comparator ($5b$) the divided voltage output is also higher than the reference voltage and therefore a positive potential signal is applied to the shift register ($5c$) in accordance with the signal from the comparator ($5a$). In response to the application of these potential signals, the shift register ($5c$) further shifts up one place so that a range select signal (c) is applied to the range selector circuit (4) and the switching elements ($S_3$), ($S_7$) and ($S_{11}$) are turned on.

When the switching element ($S_3$) is turned on, the input voltage results in a divided voltage output of 0.04 V due to the voltage division ratio (1:499) of the resistors ($R_o$) and ($R_3$). At this time, this divided voltage output is within the range of the reference voltages of the comparators ($5a$) and ($5c$) and therefore the shift register ($5c$) maintains the range select signal (c) being generated. In accordance with the divided voltage output produced by this signal, the indicator (8) moves the pointer to indicate the input voltage from the object to be measured. Also, the range display (6) also receives the range select signal (c) so that the switching element ($S_{23}$) is turned on and the LED ($L_3$) is turned on, thereby informing the person undergoing the measurement of the measuring range of 100 V.

Where the current value and resistance value of the object to be measured are measured, in accordance with the range selector circuit (4) and the range select signal generating circuit (5) the proper measuring range can be automatically determined and the value can be easily read.

Therefore, in accordance with the present invention the range select signal generating circuit generates a range select signal to select one of the voltage dividers of the range selector circuit so that the divided voltage output of an object to be measured divided through the range selector circuit comes into a predetermined range, and also the range display displays the corresponding measuring range in accordance with the signal. Thus, even if the measurand of the object to be measured is undetermined, the optimum measuring range can be known automatically and the measurand or the value to be measured can be easily read.

What is claimed is:

1. An automatic range selecting analog tester comprising:

a selector switch for selecting an object to be measured, such as, voltage, current or resistance;

a range selector circuit including a plurality of voltage dividers preset in correspondence to a plurality of measuring ranges for each said object to be measured, whereby one of said voltage dividers is selected in accordance with an applied range select signal, and an input value of each said object applied through said selector switch is subjected to voltage division;

an indicator for indicating the input value of said object on a scale in accordance with a divided output voltage of said range selector circuit;

a first comparator coupled to an output of one of said voltage dividers for generating an up signal when said divided output voltage is higher than a predetermined upper limit value and for generating a hold signal when said divided output voltage is lower than said upper limit value;

a second comparator coupled to said output of one of said voltage dividers for generating a down signal when said output voltage is lower than a predetermined lower limit value and for generating a hold signal when said divided output voltage is higher than said lower limit value; and a shift register for applying, during an initial period, a range select signal to one of said voltage dividers corresponding to a given one of said measuring ranges for selecting said given measuring range, said shift register responding to the application of an up signal from said first comparator by shifting up one place for applying a range select signal to one of said voltage dividers corresponding to one of said measuring ranges greater than the one being currently selected, said shift register responding to the application of a down signal from said second comparator by shifting down one place for applying a range select signal to one of said voltage dividers corresponding to one of said measuring ranges smaller than the one being currently selected, said shift register not shifting either up or down for maintaining said selected range when said first and second comparators generate hold signals;

range display means including a plurality of display units each corresponding to one of said measuring ranges for turning on one of said display units in response to the application of a range select signal.

2. An automatic range selecting analog tester according to claim 1, wherein each of said voltage dividers of said range selector circuit includes a predetermined resistor for each said object to be measured corresponding to one of said voltage dividers and a switching element coupled to said resistor for subjecting an input value of said object to be measured to voltage division; whereby said range select signal from said shift register is coupled to said switching element of said voltage divider associated with the selected one of said measuring ranges for turning said switching element on.

* * * * *